(12) United States Patent
Lu

(10) Patent No.: US 11,177,552 B2
(45) Date of Patent: Nov. 16, 2021

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 74 days.

(21) Appl. No.: 16/578,092

(22) Filed: Sep. 20, 2019

(65) Prior Publication Data

US 2021/0091453 A1    Mar. 25, 2021

(51) Int. Cl.
| | |
|---|---|
| H01Q 1/22 | (2006.01) |
| H01L 23/498 | (2006.01) |
| H01L 21/48 | (2006.01) |
| H01Q 1/38 | (2006.01) |
| H01Q 9/04 | (2006.01) |
| H01L 23/66 | (2006.01) |
| H01L 23/00 | (2006.01) |

(52) U.S. Cl.
CPC ....... *H01Q 1/2283* (2013.01); *H01L 21/4846* (2013.01); *H01L 23/49816* (2013.01); *H01L 23/49838* (2013.01); *H01L 23/66* (2013.01); *H01Q 1/38* (2013.01); *H01Q 9/0407* (2013.01); *H01L 24/16* (2013.01); *H01L 24/32* (2013.01); *H01L 24/73* (2013.01); *H01L 2223/6677* (2013.01); *H01L 2224/16227* (2013.01); *H01L 2224/16238* (2013.01); *H01L 2224/32225* (2013.01); *H01L 2224/73204* (2013.01)

(58) Field of Classification Search
CPC .............. H01Q 1/2283; H01L 21/4846; H01L 23/49816; H01L 23/49838; H01L 23/66
See application file for complete search history.

(56) References Cited

U.S. PATENT DOCUMENTS

| | | | |
|---|---|---|---|
| 9,252,077 B2 | 2/2016 | Molzer et al. | |
| 10,531,577 B1* | 1/2020 | Grober | H05K 3/428 |
| 2018/0327530 A1* | 11/2018 | Wakita | C08F 220/14 |

* cited by examiner

*Primary Examiner* — Marc Anthony Armand
(74) *Attorney, Agent, or Firm* — Foley & Lardner LLP

(57) ABSTRACT

A semiconductor device package includes a dielectric layer and a stacking conductive structure. The dielectric layer includes a first surface. The stacking conductive structure is disposed on the first surface of the dielectric layer. The stacking conductive structure includes a first conductive layer disposed on the first surface of the dielectric layer, and a second conductive layer stacked on the first conductive layer. A first surface roughness of the first surface of the dielectric layer is larger than a second surface roughness of a top surface of the first conductive layer, and the second surface roughness of the top surface of the first conductive layer is larger than a third surface roughness of a top surface of the second conductive layer.

20 Claims, 12 Drawing Sheets

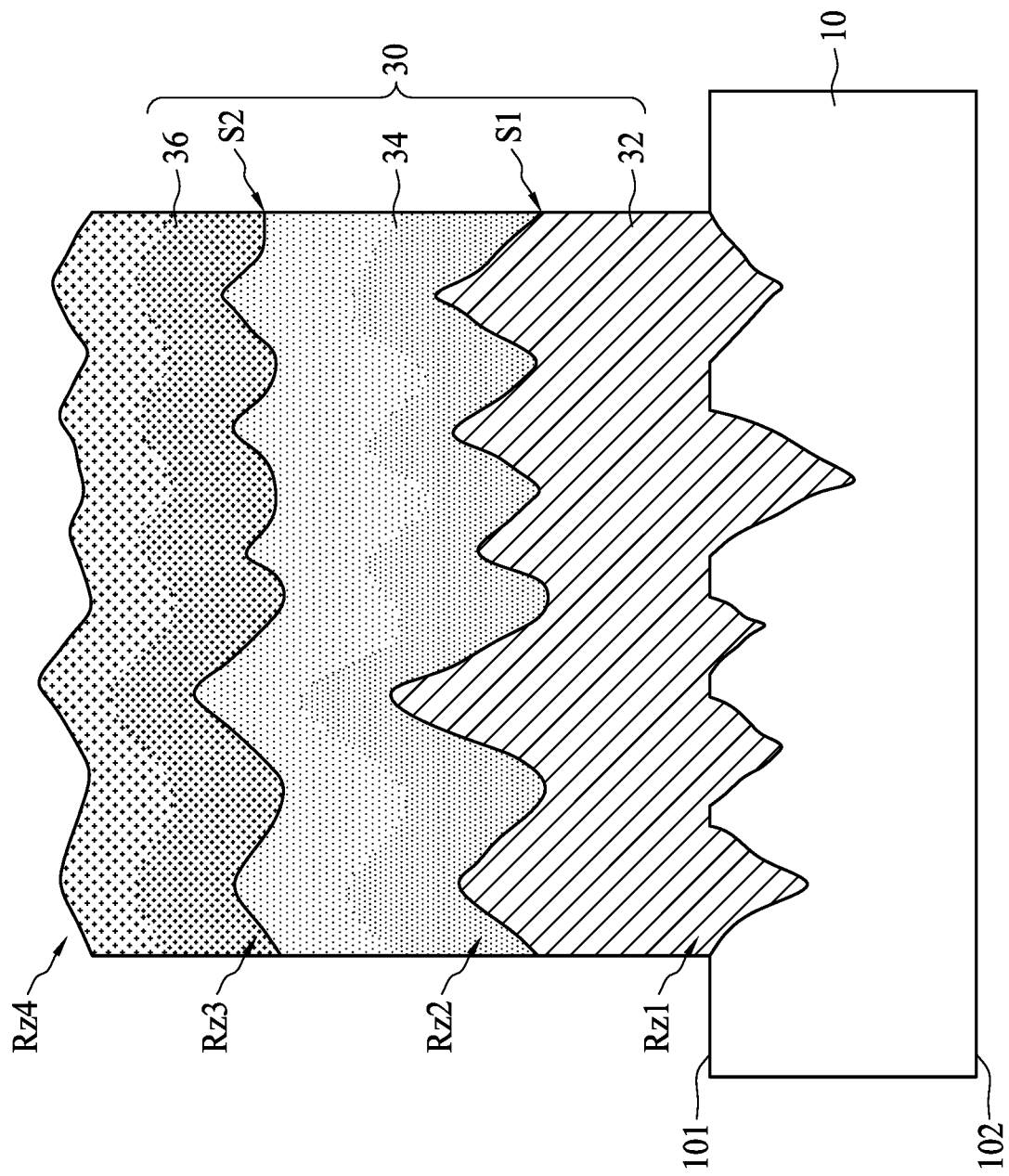

SEMICONDUCTOR DEVICE PACKAGE AND METHOD FOR MANUFACTURING THE SAME

BACKGROUND

1. Technical Field

The present disclosure relates to a semiconductor device package and a method for manufacturing the same, and to a semiconductor device package including a stacking conductive structure with a smooth surface and a method for manufacturing the same.

2. Description of the Related Art 5G communication system may be implemented in very high frequency range (e.g., 30 GHz-300 GHz), and is adapted to achieve a high data transfer rate. At high frequency signal transmission such as microwave or millimeter wave signal transmission, the current tends to flow in a transmission path adjacent to the perimeter of the conductor, which is known as skin effect. As the surface roughness of the conductor increases, the transmission path is increased accordingly. As a result, the insertion loss is severe.

SUMMARY

In some embodiments, a semiconductor device package includes a dielectric layer and a stacking conductive structure. The dielectric layer includes a first surface. The stacking conductive structure is disposed on the first surface of the dielectric layer. The stacking conductive structure includes a first conductive layer disposed on the first surface of the dielectric layer, and a second conductive layer stacked on the first conductive layer. A first surface roughness of the first surface of the dielectric layer is larger than a second surface roughness of a top surface of the first conductive layer, and the second surface roughness of the top surface of the first conductive layer is larger than a third surface roughness of a top surface of the second conductive layer.

In some embodiments, a semiconductor device package includes a dielectric layer and a stacking conductive structure. The dielectric layer includes a first surface. The stacking conductive structure is disposed on the first surface of the dielectric layer. The stacking conductive structure includes a first conductive layer disposed on the first surface of the dielectric layer, a second conductive layer stacked on the first conductive layer, and an interface between the first conductive layer and the second conductive layer. The grain size of the second conductive layer is smaller than or substantially equal to a grain size of the first conductive layer.

In some embodiments, a method of manufacturing a semiconductor device package is provided. A dielectric layer is formed. A first operation is performed to form a first conductive layer on the dielectric layer. A second operation is performed to form a second conductive layer interfacing the first conductive layer. A grain size of the second conductive layer formed by the second operation is substantially equal to or smaller than a grain size of the first conductive layer formed by the first operation.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 3A is an enlarged cross-sectional view of a stacking conductive structure in FIG. 3 in accordance with some embodiments of the present disclosure.

DETAILED DESCRIPTION

Figure 1:
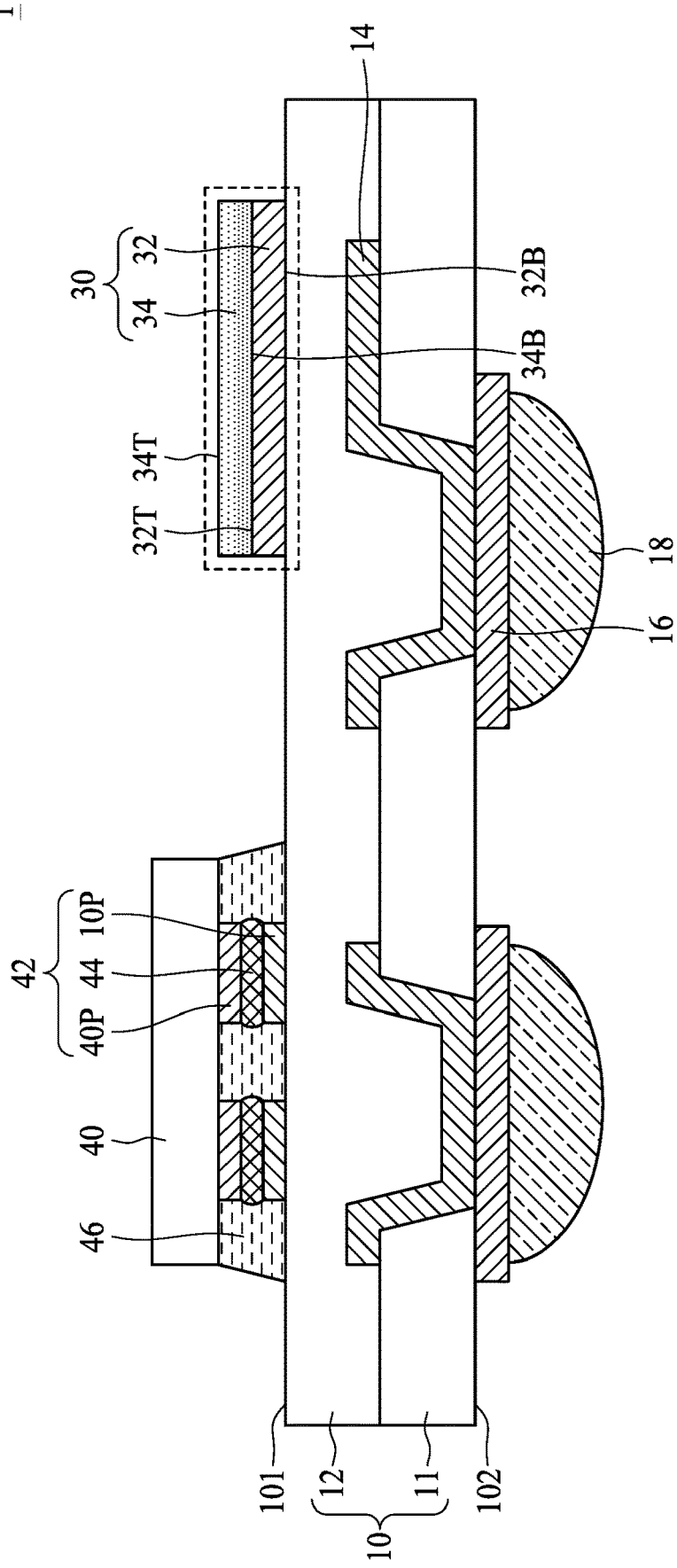
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some embodiments, the present disclosure provides a semiconductor device package and a method for manufacturing the same. The semiconductor device package includes a stacking conductive structure having a plurality of conductive layers stacked on a dielectric layer. By stacking the plurality of conductive layers, the surface roughness of the overlying conductive layer can be smoothened to be smaller than that of the underlying conductive layer, and thus the surface roughness can be beyond the process limit of the conductive layer. Accordingly, the transmission path of the current flow can be shortened to alleviate insertion loss of the stacking conductive structure due to skin effect, particularly in high frequency signal transmission.

Figure 1A:
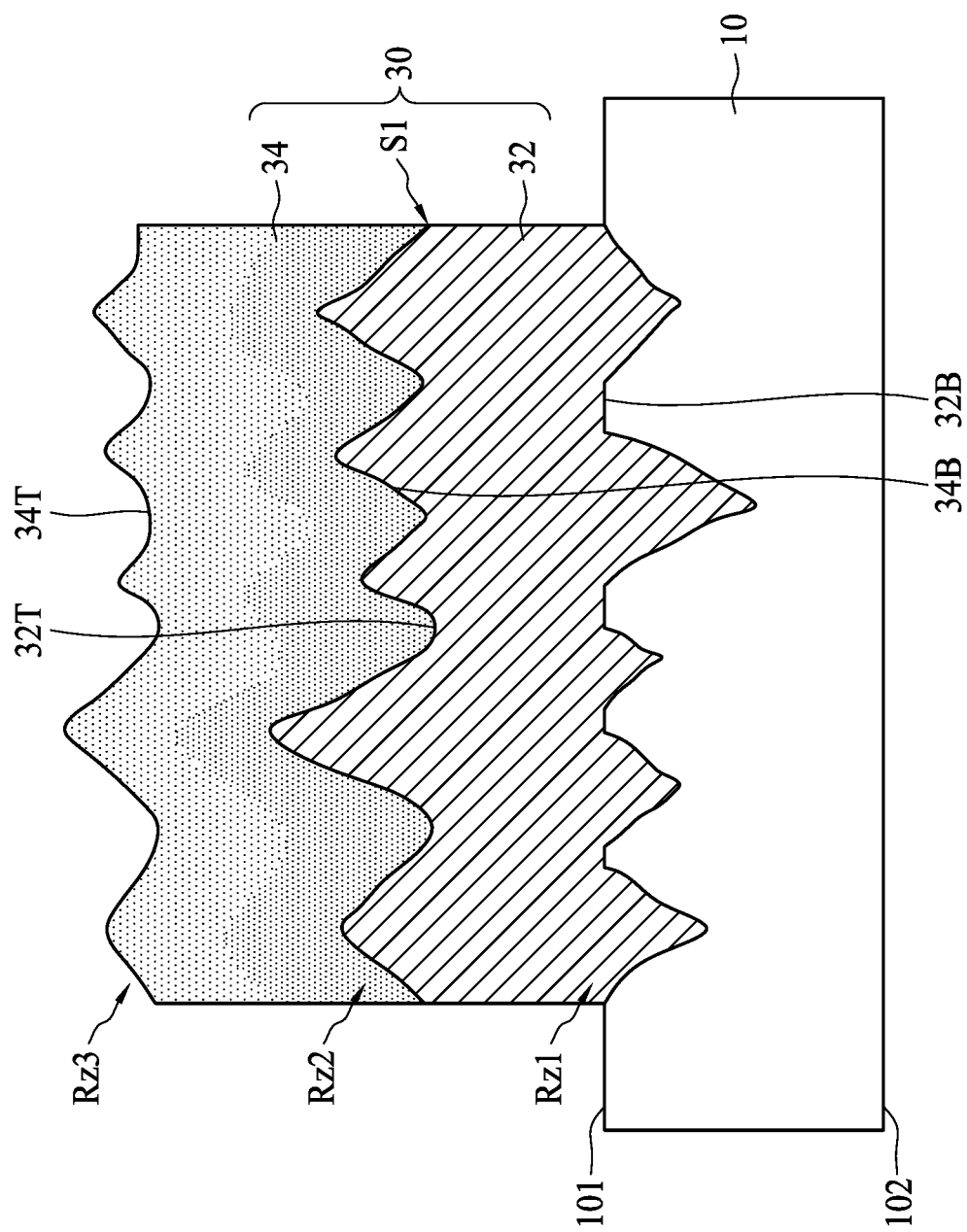
FIG. 1A is an enlarged cross-sectional view of a stacking conductive structure in FIG. 1 in accordance with some embodiments of the present disclosure.

FIG. 1 is a cross-sectional view of a semiconductor device package 1 in accordance with some embodiments of the present disclosure, and FIG. 1A is an enlarged cross-sectional view of a stacking conductive structure 30 in FIG. 1 in accordance with some embodiments of the present disclosure. As shown in FIG. 1 and FIG. 1A, the semiconductor device package 1 includes a dielectric layer 10 and a stacking conductive structure 30. The dielectric layer 10 includes a first surface 101, and a second surface 102 opposite to the first surface 101. In some embodiments, the dielectric layer 10 may include a plurality of dielectric films 11, 12 stacked on each other. One or more conductive wirings 14 may be disposed alternately with the dielectric films 11, 12, forming a circuit layer such as a redistribution layer (RDL). In some embodiments, the dielectric film 12 may be an uppermost dielectric layer of the circuit layer. Examples of the dielectric films 11, 12 may individually include organic dielectric material such as Polypropylene (PP), polyimide (PI), epoxy, FR4 glass fiber, inorganic dielectric material such as silicon oxide, silicon nitride, ceramic, glass, sapphire, or a combination thereof. The conductive wirings 14 may include conductive traces, conductive vias or a combination thereof. Examples of the material of the conductive wiring 14 may include metal such as gold (Au), silver (Ag), copper (Cu), aluminum (Al), platinum (Pt), palladium (Pd) or an alloy thereof.

In some embodiments, the semiconductor device package 1 may include a semiconductor chip 40 disposed on the first surface 101 of the dielectric layer 10, and electrically coupled to the stacking conductive structure 30, through for example the conductive wirings 14. The semiconductor chip 40 may include active chip, passive chip or a combination thereof. The semiconductor chip 40 may be electrically connected to the conductive wirings 14 through conductive structures 42. By way of example, each conductive structure 42 may include a bonding pad 10P disposed adjacent to the first surface 101 of the dielectric layer 10 and electrically connected to the conductive wirings 14, another bonding pad 40P disposed adjacent to and electrically connected to the semiconductor chip 40, and a connector structure 44 disposed between and electrically connected to the bonding pads 10P, 40P. In some embodiments, the bonding pads 10P, 40P may each include an under bump metallurgy (UBM), a conductive bump such as copper stud or copper pillar, or the like. In some embodiments, the connector structure 44 may include a solder structure such as solder bump or the like. In some embodiments, an underfill 46 may be disposed between the semiconductor chip 40 and the dielectric layer 10. In some other embodiments, the semiconductor chip 40 may be embedded in the dielectric layer 10, for example embedded in the dielectric film 12.

In some embodiments, bonding pads 16 may be disposed on the second surface 102 of the dielectric layer 10, and electrically connected to the conductive wirings 14 exposed from the second surface 102 of the dielectric layer 10. In some embodiments, electrical connectors 18 may be disposed on the second surface 102 of the dielectric layer 10, and electrically connected to the semiconductor chip 40 through the bonding pads 16, the conductive wirings 14 and the conductive structures 42. The electrical connectors 18 may include solder connectors such as solder balls or the like, and may be configured to build an electrical connection to external circuit such as a printed circuit board (PCB) or the like.

The stacking conductive structure 30 is disposed on the first surface 101 of the dielectric layer 10. In some embodiments, the stacking conductive structure 30 includes an antenna structure. By way of example, the stacking conductive structure 30 may include a patch antenna. Then antenna structure may be configured to implement wireless communication at high frequency range (e.g., 30 GHz-300 GHz or 50 GHz-200 GHz), but is not limited thereto. The stacking conductive structure 30 may be electrically connected to the conductive wires 14, or electrically coupled to the conductive wires 14.

The stacking conductive structure 30 includes at least two conductive layers stacking on each other. By way of example, the stacking conductive structure 30 includes a first conductive layer 32 disposed on the first surface 101 of the dielectric layer 10, and a second conductive layer 34 stacked on the first conductive layer 32. The first conductive layer 32 includes a top surface 32T, and a bottom surface 32B opposite to the top surface 32T. In some embodiments, the bottom surface 32B of the first conductive layer 32 may interface the first surface 101 of the dielectric layer 10, and an interface S1 may exist between the first conductive layer 32 and the second conductive layer 34. The second conductive layer 32 includes a top surface 34T, and a bottom surface 34B opposite to the top surface 34T. In some embodiments, the bottom surface 34B may interface with the top surface 32T of the first conductive layer 32. In some embodiments, each conductive layer of the stacking conductive structure 30 is a solder-free material. The dimension of each conductive layer of the stacking conductive structure 30 may be substantially the same. In some embodiments, the surface roughness of an overlying layer of the stacking conductive structure 30 is smaller than the surface roughness of an underlying layer of the stacking conductive structure 30. For example, a first surface roughness Rz1 of the first surface 101 of the dielectric layer 10 is larger than a second surface roughness Rz2 of the top surface 32T of the first conductive layer 32, and the second surface roughness Rz2 of the top surface 32T of the first conductive layer 32 is larger than a third surface roughness Rz3 of the top surface 34T of the second conductive layer 34. In some embodiments, the surface roughness is measured by ten-point mean roughness (Rz), which is the average maximum peak to valley of five consecutive sampling lengths within the measuring length.

In some embodiments, a material of the first conductive layer 32 is different from a material of the second conductive layer 34, and the grain size of a material of the second conductive layer 34 is smaller than a grain size of a material of the first conductive layer 32. By way of example, the material of the dielectric layer 10 includes Polypropylene (PP), the material of the first conductive layer 32 includes copper, and the material of the second conductive layer 34 includes graphene. The first conductive layer 32 can be formed on by electroplating, physical vapor deposition (PVD) or the like, and the second conductive layer can be formed by PVD or the like. In some exemplary embodiments, the first surface roughness Rz1 of the first surface 101 is ranging from about 0.4 micrometers to about 2.0 micrometers, the second surface roughness Rz2 of the top surface 32T of the first conductive layer (plating copper) 32 overlying the dielectric layer 10 is ranging from about 1.0 micrometer to about 1.6 micrometers, and the third surface roughness Rz3 of the top surface 34T of the second conductive layer (graphene) 34 overlying the first conductive layer 32 is ranging from about 0.05 micrometers to about 0.20 micrometers. By virtue of stacking a plurality of conductive layers such as the first conductive layer 32 and the second conductive layer 34 on the dielectric layer 10, the surface roughness of the uppermost surface such as the top surface 34T of the stacking conductive structure 30 can be reduced compared to that of a single-layered conductive layer. The smooth surface of the stacking conductive structure 30 can shorten the transmission path of signals, thereby alleviating insertion loss due to skin effect, particularly in high frequency signal transmission. Accordingly, antenna performance can be improved. In some embodiments, the second conductive layer 34 may have non-uniform density distribution. For example, and the density of an upper portion of the second conductive layer 34 is lower than a density of a lower portion of the second conductive layer 34.

In some other embodiments, the first conductive layer (plating copper) 32 can be further grinded prior to formation of the second conductive layer (graphene) 34. In some other exemplary embodiments, the first surface roughness Rz1 of the first surface 101 is ranging from about 0.4 micrometers to about 2.0 micrometers, the second surface roughness Rz2 of the top surface 32T of the first conductive layer (grinding copper) 32 overlying the dielectric layer 0 is ranging from about 0.25 micrometers to about 0.5 micrometers, and the third surface roughness Rz3 of the top surface 34T of the second conductive layer (graphene) 34 overlying the first conductive layer 32 is ranging from about 0.05 micrometers to about 0.10 micrometers.

In some embodiments, the dielectric film 12 may be recessed, and the stacking conductive structure 30 may be at least partially disposed in the recessed portion of the dielectric film 12. In some embodiments, the stacking conductive structure 30 may be in contact with the conductive wirings 14.

In some embodiments, the semiconductor device package 1 may further include an encapsulation layer (not shown) encapsulating the semiconductor chip. The encapsulation layer may include molding compound, molding gel or the like, and fillers may be incorporated into the encapsulation layer. In some embodiments, the underfill 46 may be omitted, and the encapsulation layer may further be disposed between the semiconductor chip 40 and the dielectric layer 10.

The semiconductor device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 2:
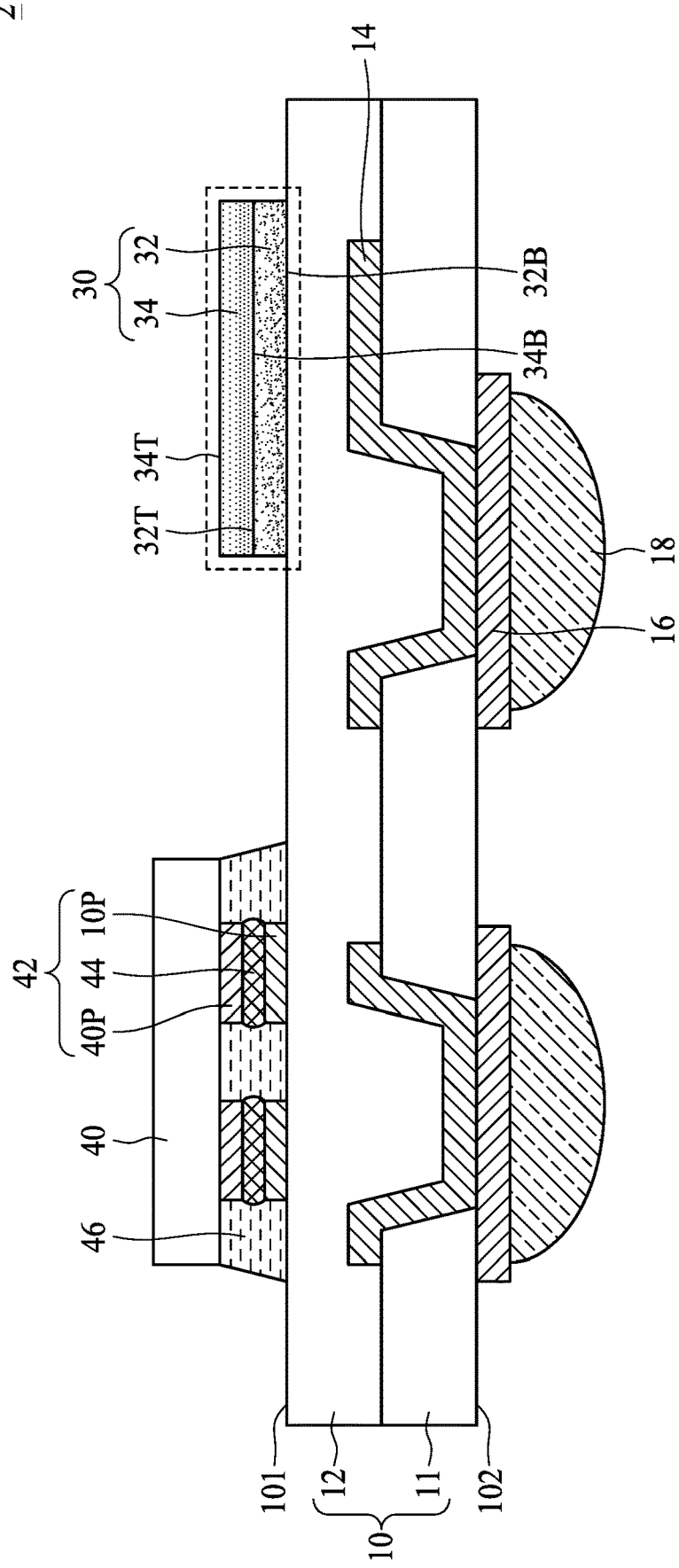
FIG. 2 is a cross-sectional view of a semiconductor device package in accordance with some embodiments of the present disclosure.
Figure 2A:
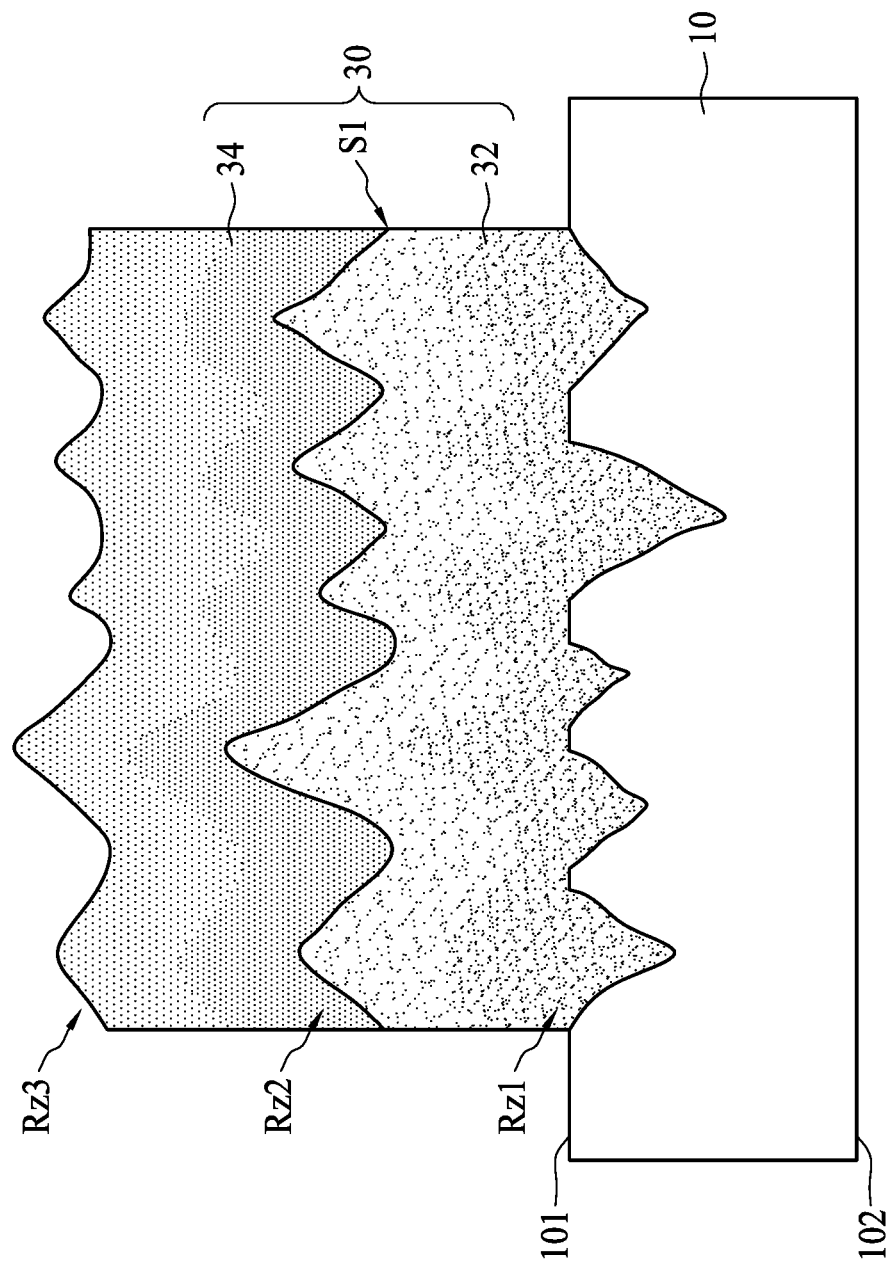
FIG. 2A is an enlarged cross-sectional view of a stacking conductive structure in FIG. 2 in accordance with some embodiments of the present disclosure.

FIG. 2 is a cross-sectional view of a semiconductor device package 2 in accordance with some embodiments of the present disclosure, and FIG. 2A is an enlarged cross-sectional view of a stacking conductive structure 30 in FIG. 2 in accordance with some embodiments of the present disclosure. As shown in FIG. 2 and FIG. 2A, in contrast to the semiconductor device package 1 in FIG. 1, a material of the first conductive layer 32 is the same as a material of the second conductive layer 34, and the grain size of a material of the second conductive layer 34 is substantially equal to a grain size of a material of the first conductive layer 32. By way of example, the material of the dielectric layer 10 includes Polypropylene (PP), and the material of the first conductive layer 32 and the second conductive layer 34 may both include graphene. In some embodiments, the first conductive layer 32 and the second conductive layer 34 may be formed by two separate PVD processes, and each of the first conductive layer 32 and the second conductive layer 34 may have non-uniform density distribution. For example, the density of an upper portion of the first conductive layer 32 is lower than a density of a lower portion of the first conductive layer 32, and the density of an upper portion of the second conductive layer 34 is lower than a density of a lower portion of the second conductive layer 34. Due to the density difference, an interface S1 may exist between the first conductive layer 32 and the second conductive layer 34.

Figure 3:
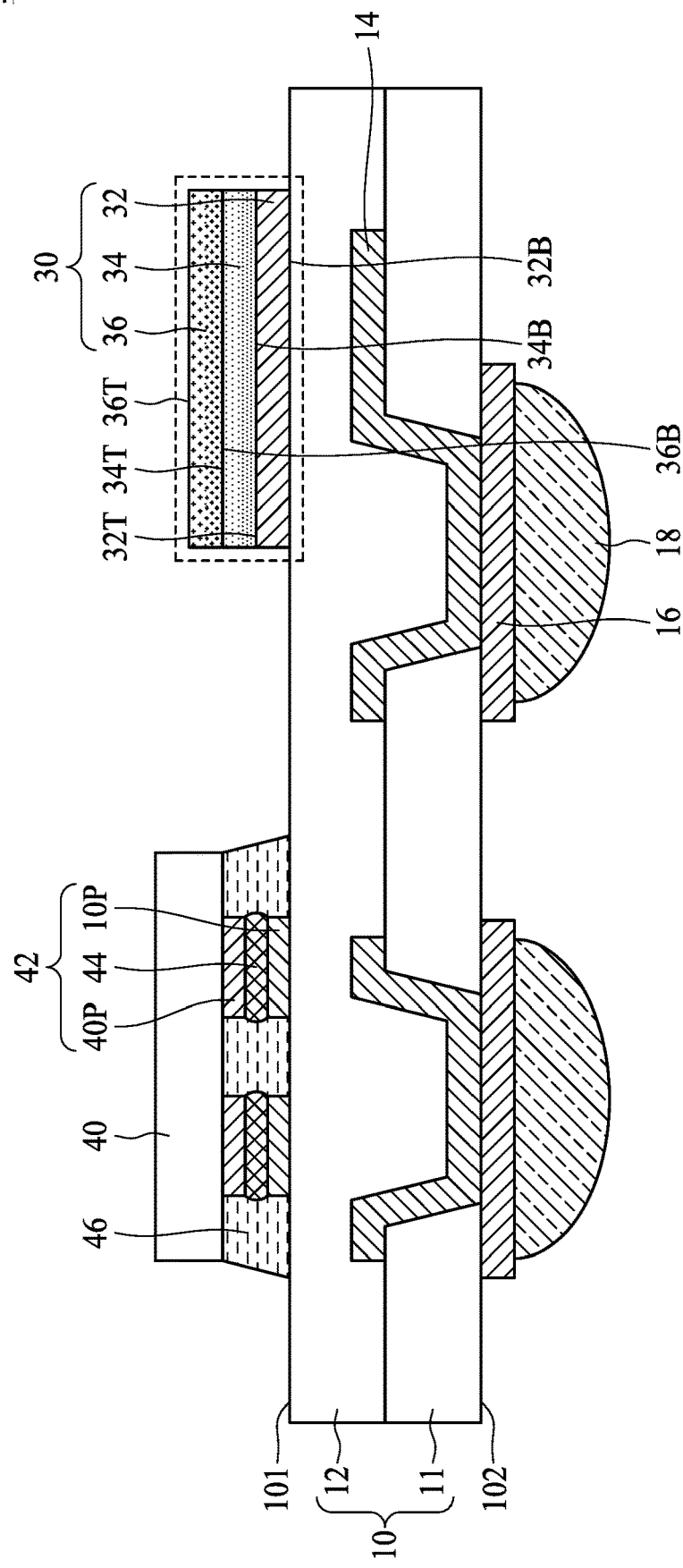
FIG. 3 is a cross-sectional view of a semiconductor device package in accordance with some embodiments of the present disclosure.

FIG. 3 is a cross-sectional view of a semiconductor device package 3 in accordance with some embodiments of the present disclosure, and FIG. 3A is an enlarged cross-sectional view of a stacking conductive structure 30 in FIG. 3 in accordance with some embodiments of the present disclosure. As shown in FIG. 3 and FIG. 3A, in contrast to the semiconductor device package 1 in FIG. 1, the stacking conductive structure 30 further includes a third conductive layer 36 stacked on the top surface 34T of the second conductive layer 34. The third conductive layer 36 includes a top surface 36T, and a bottom surface 36B opposite to the top surface 36T. In some embodiments, the bottom surface 36B of the third conductive layer 36 may interface the top surface 34T of the second conductive layer 34. In some embodiments, the surface roughness of an overlying layer of the stacking conductive structure 30 is smaller than the surface roughness of an underlying layer of the stacking conductive structure 30. For example, a first surface roughness Rz1 of the first surface 101 of the dielectric layer 10 is larger than a second surface roughness Rz2 of the top surface 32T of the first conductive layer 32, the second surface roughness Rz2 of the top surface 32T of the first conductive layer 32 is larger than a third surface roughness Rz3 of the top surface 34T of the second conductive layer 34, and the third surface roughness Rz3 of the top surface 34T of the second conductive layer 34 is larger than a fourth surface roughness Rz4 of the top surface 36T of the third conductive layer 36.

In some embodiments, a grain size of the material of the third conductive layer 36 is substantially equal to a grain size of the material of the second conductive layer 34, and the grain size of the material of the second conductive layer 34 is smaller than a grain size of the material of the first conductive layer 32. By way of example, the material of the first conductive layer 32 includes copper, and the material of the second conductive layer 34 and the third conductive layer 36 includes graphene. In some embodiments, the second conductive layer 34 and the third conductive layer 36 may be formed by two separate PVD processes, and each of the second conductive layer 34 and the third conductive layer 36 may have non-uniform density distribution. For example, process temperature in the PVD process may increase with time. Accordingly, the density of an upper portion of the second conductive layer 34 is lower than a density of a lower portion of the second conductive layer 34, and the density of an upper portion of the third conductive layer 36 is lower than a density of a lower portion of the third conductive layer 36. Accordingly, an interface S2 may exist between the second conductive layer 34 and the third conductive layer 36. By virtue of stacking the third conductive layer 36 on the second conductive layer 34, the surface roughness of the uppermost surface such as the top surface 36T of the stacking conductive structure 30 can be further reduced.

Figure 4A:
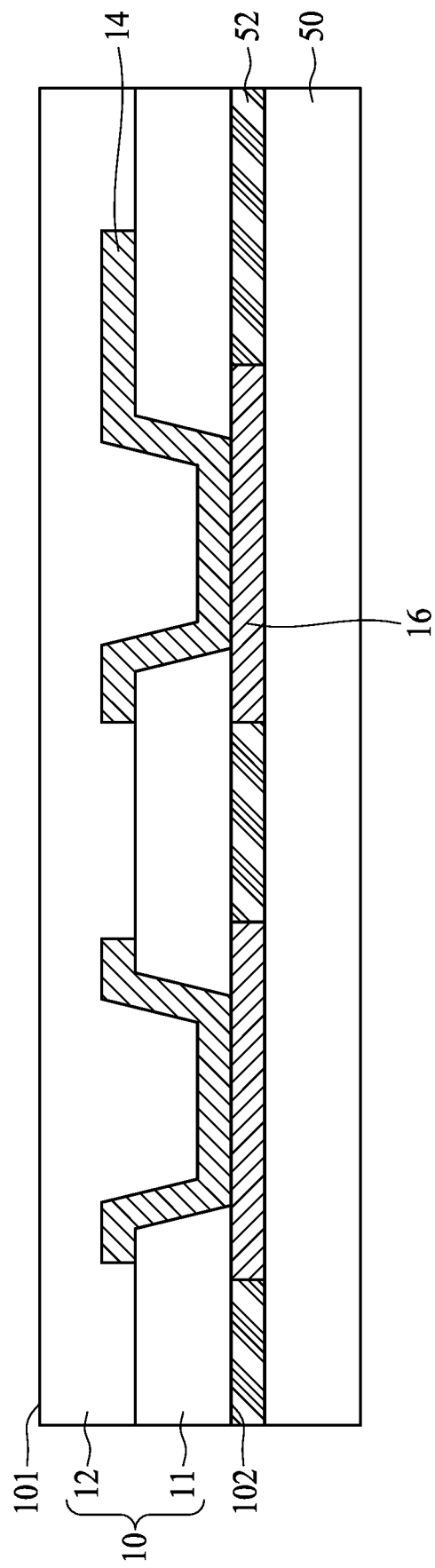
FIG. 4A, FIG. 4B, FIG. 4C, FIG. 4D, FIG. 4E and FIG. 4F illustrate operations of manufacturing a semiconductor device package in accordance with some embodiments of the present disclosure.

FIG. 4A, FIG. 4B, FIG. 4C, FIG. 4D, FIG. 4E and FIG. 4F illustrate operations of manufacturing a semiconductor device package in accordance with some embodiments of the present disclosure. As shown in FIG. 4A, a dielectric layer 10 including a first surface 101 and a second surface 102 is formed on a carrier 50 having a buffer layer 52, for example. In some embodiments, the dielectric layer 10 may include a plurality of dielectric films 11, 12 stacked on each other, and one or more conductive wirings 14 may be formed alternately with the dielectric films 11, 12. In some embodiments, bonding pads 16 may be formed on the second surface 102 of the dielectric layer 10, and electrically connected to the conductive wirings 14 exposed from the second surface 102 of the dielectric layer 10.

Figure 4B:
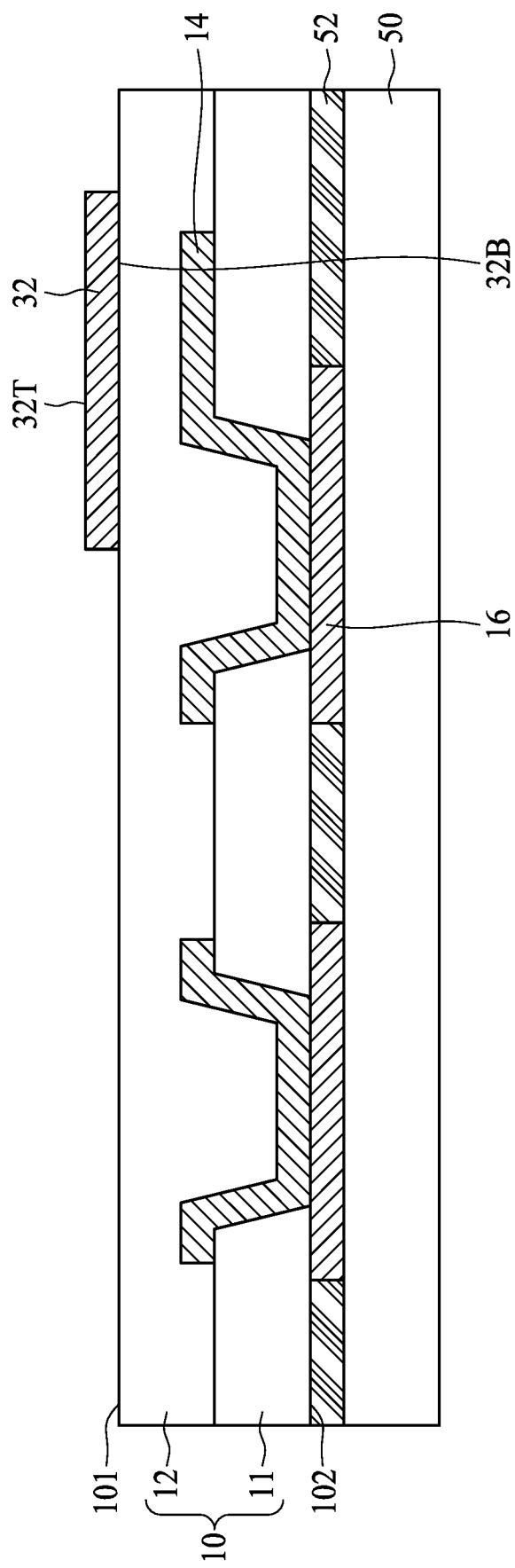
Figure 4C:
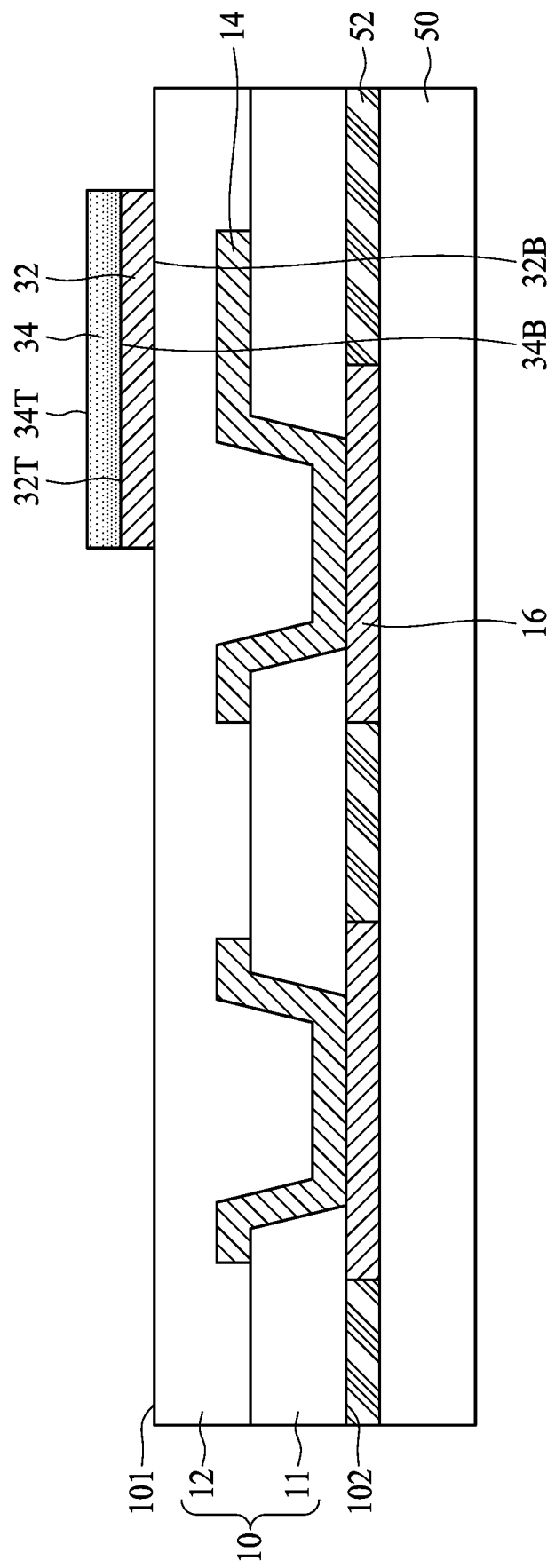

As shown in FIG. 4B, a first operation is performed to form a first conductive layer 32 on the first surface 101 of the dielectric layer 10. As shown in FIG. 4C, a second operation is performed to form a second conductive layer 34 interfacing the first conductive layer 32. In some embodiments, a grain size of the second conductive layer 34 formed by the second operation is substantially equal to or smaller than a grain size of the first conductive layer 32 formed by the first operation. In case the grain size of the second conductive layer 34 is smaller than the grain size of the first conductive layer 32, the first operation may include electroplating, physical vapor deposition (PVD) or the like, and the second operation may include PVD or the like. For example, the material of the first conductive layer 32 includes copper, and the material of the second conductive layer 34 includes graphene. In case the grain size of the second conductive layer 34 is substantially equal to the grain size of the first conductive layer 32, the first operation and the second operation may include two separate PVD processes. For example, the material of the first conductive layer 32 and the second conductive layer 34 may both include graphene. In addition, the density of an upper portion of the first conductive layer 32 may be lower than a density of a lower portion of the first conductive layer 32, and the density of an upper portion of the second conductive layer 34 may be lower than a density of a lower portion of the second conductive layer 34. Due to the density difference, an interface may exist between the first conductive layer 32 and the second conductive layer 34. In some embodiments, the first conductive layer 32 may be grinded to reduce a surface roughness of the first conductive layer 32 prior to the second operation.

Figure 4D:
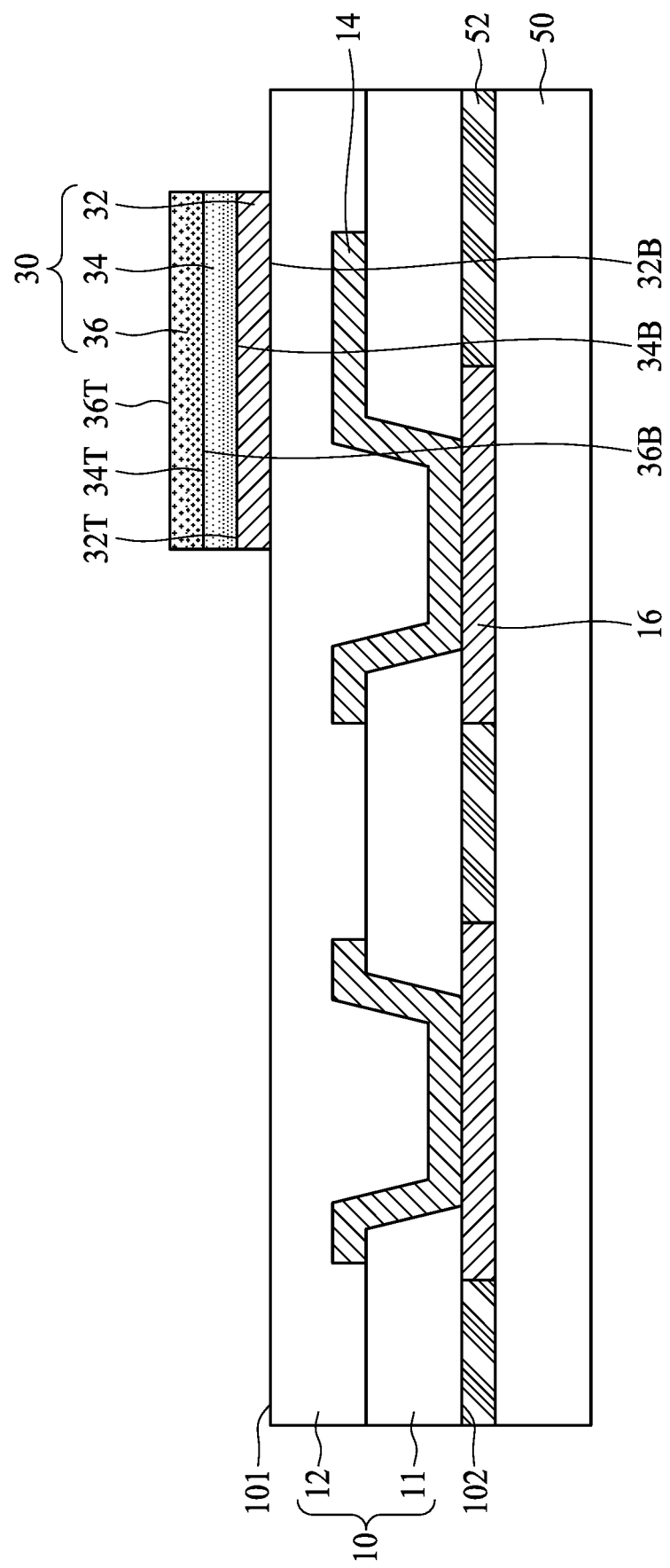

As shown in FIG. 4D, a third operation may be performed to form a third conductive layer 36 if specified. The third operation may include a PVD processes, and the material of the third conductive layer 36 may both include graphene.

Figure 4E:
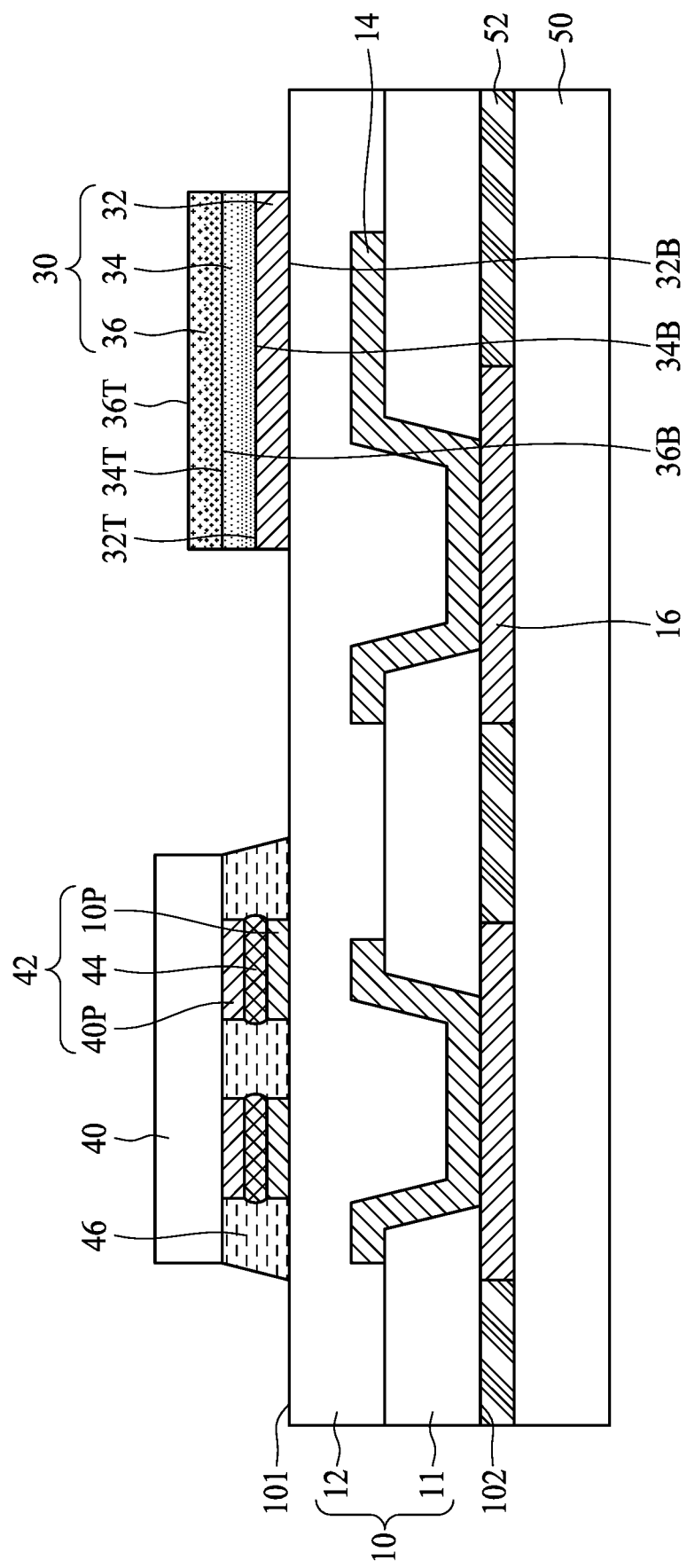

As shown in FIG. 4E, a semiconductor chip 40 is formed on the first surface 101 of the dielectric layer 10, and electrically connected to or coupled to the stacking conductive structure 30, through for example the conductive wirings 14. The semiconductor chip 40 may be electrically connected to the conductive wirings 14 through conductive structures 42. By way of example, each conductive structure 42 may include a bonding pad 10P disposed adjacent to the first surface 101 of the dielectric layer 10 and electrically connected to the conductive wirings 14, another bonding pad 40P disposed adjacent to and electrically connected to the semiconductor chip 40, and a connector structure 44 disposed between and electrically connected to the bonding pads 10P, 40P. In some embodiments, the bonding pads 10P, 40P may each include an under bump metallurgy (UBM), a conductive bump such as copper stud or copper pillar, or the like. In some embodiments, the connector structure 44 may include a solder structure such as solder bump or the like. In some embodiments, an underfill 46 may be formed between the semiconductor chip 40 and the dielectric layer 10.

Figure 4F:
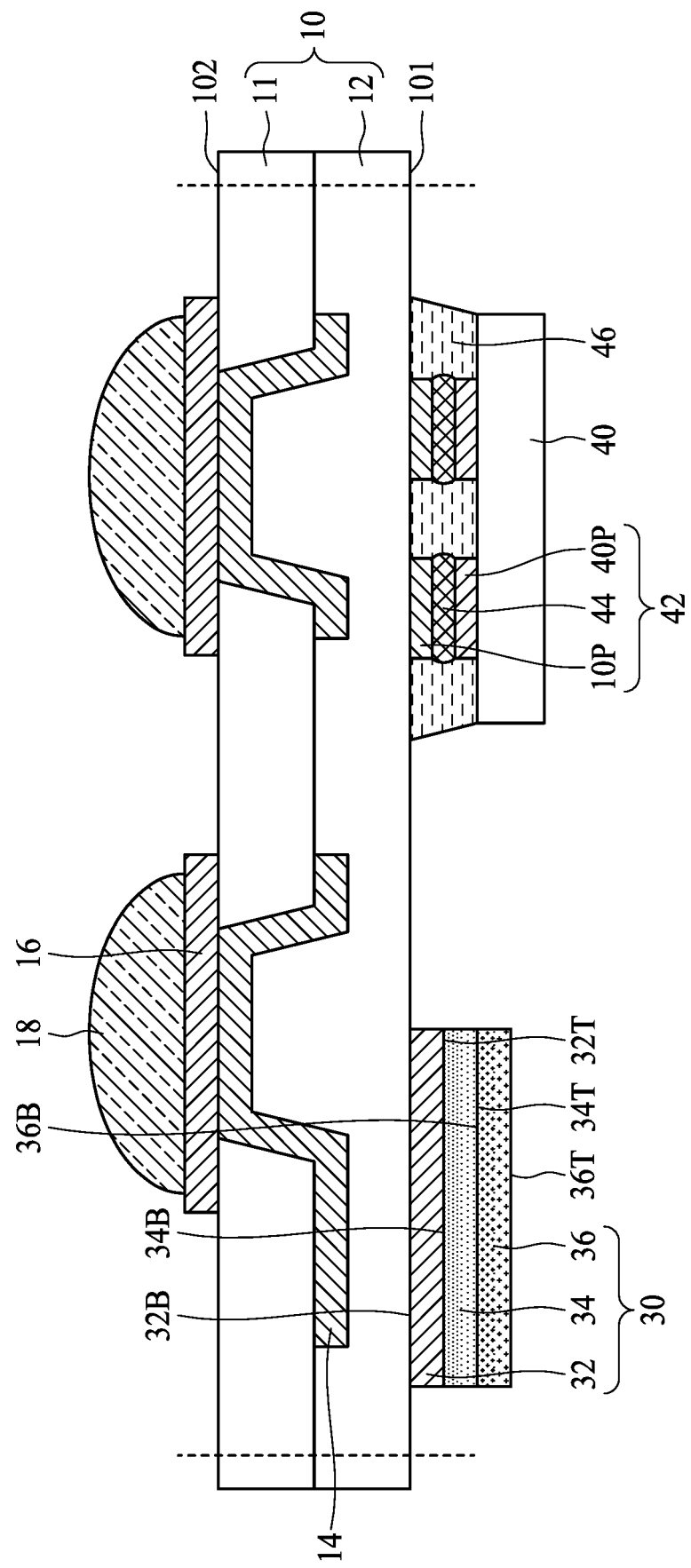

As shown in FIG. 4F, the carrier 50 and the buffer layer 52 are removed from the second surface 102 of the dielectric layer 10. Electrical connectors 18 may be formed on the second surface 102 of the dielectric layer 10, and electrically connected to the semiconductor chip 40 through the bonding pads 16, the conductive wirings 14 and the conductive structures 42. A singulation operation can be performed to form the semiconductor device package 1 as shown in FIG. 1, the semiconductor device package 2 as shown in FIG. 2, or the semiconductor device package 3 as shown in FIG. 3.

In some embodiments of the present disclosure, the semiconductor device package includes a stacking conductive structure having a plurality of conductive layers stacked on a dielectric layer. By stacking the plurality of conductive layers, the surface roughness of the overlying conductive layer can be smoothened to be smaller than that of the underlying conductive layer, and thus the surface roughness can be beyond the process limit of the conductive layer. Accordingly, the transmission path of the current flow can be shortened to alleviate insertion loss of the stacking conductive structure due to skin effect, particularly in high frequency signal transmission.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a dielectric layer including a first surface; and
   an antenna disposed on the first surface of the dielectric layer, wherein the antenna comprises a first conductive layer disposed on the first surface of the dielectric layer, and a second conductive layer stacked on the first conductive layer,
   wherein a first surface roughness of the first surface of the dielectric layer is larger than a second surface roughness of a top surface of the first conductive layer, and the second surface roughness of the top surface of the first conductive layer is larger than a third surface roughness of a top surface of the second conductive layer, and
   wherein the first surface roughness is ranging from about 0.4 micrometers to about 2.0 micrometers, the second surface roughness is ranging from about 1.0 micrometer to about 1.6 micrometers, and the third surface roughness is ranging from about 0.05 micrometers to about 0.20 micrometers, wherein the first, second, and third surface roughnesses are measured by ten-point mean roughness (Rz), which is the average maximum peak to valley of five consecutive sampling lengths within the measuring length.

2. The semiconductor device package of claim 1, wherein a grain size of a material of the second conductive layer is smaller than a grain size of a material of the first conductive layer.

3. The semiconductor device package of claim 1, wherein a grain size of a material of the second conductive layer is substantially equal to a grain size of a material of the first conductive layer.

4. The semiconductor device package of claim 1, wherein at least two side surfaces of the first conductive layer and at least two side surfaces of the second conductive layer are respectively substantially coplanar.

5. The semiconductor device package of claim 1, wherein the dielectric layer includes one or more conductive wirings, and the semiconductor chip is electrically coupled to the antenna through the one or more conductive wirings.

6. The semiconductor device package of claim 1, further comprising a semiconductor chip disposed on the first surface of the dielectric layer, and electrically coupled to the antenna.

7. The semiconductor device package of claim 2, wherein the material of the first conductive layer comprises copper, and the material of the second conductive layer comprises graphene.

8. The semiconductor device package of claim 2, wherein the antenna further comprises a third conductive layer stacked on the top surface of the second conductive layer, and wherein a grain size of a material of the third conductive layer is smaller than the grain size of the material of the second conductive layer.

9. The semiconductor device package of claim 3, wherein the material of the first conductive layer and the second conductive layer comprises graphene.

10. The semiconductor device package of claim 4, wherein the material of the first conductive layer comprises copper, and the material of the second conductive layer and the third conductive layer comprises graphene.

11. The semiconductor device package of claim 6, further comprising a plurality of electrical connectors disposed on a second surface of the dielectric layer, and electrically connected to the semiconductor chip.

12. The semiconductor device package of claim 8, wherein the third surface roughness of the top surface of the second conductive layer is larger than a fourth surface roughness of a top surface of the third conductive layer.

13. The semiconductor device package of claim 8, wherein a density of an upper portion of the second conductive layer is lower than a density of a lower portion of the second conductive layer, and a density of an upper portion of the third conductive layer is lower than a density of a lower portion of the third conductive layer.

14. The semiconductor device package of claim 12 wherein the material of the second conductive layer is the same as the material of the third conductive layer, and the material of the first conductive layer is different from the material of the second conductive layer.

15. A semiconductor device package, comprising:
   a dielectric layer including a first surface and including one or more conductive wirings; and
   an antenna disposed on the first surface of the dielectric layer, wherein the antenna comprises a first conductive layer disposed on the first surface of the dielectric layer, a second conductive layer stacked on the first conductive layer, and an interface between the first conductive layer and the second conductive layer,
   wherein a grain size of the second conductive layer is smaller than a grain size of the first conductive layer, and
   wherein the semiconductor chip is configured to be electrically coupled to the antenna through the one or more conductive wirings.

16. The semiconductor device package of claim 15, wherein at least a portion of the first conductive layer is embedded in the dielectric layer.

17. The semiconductor device package of claim 16, wherein the conductive wirings is physically disconnected from the antenna.

18. The semiconductor device package of claim 16, wherein the antenna further comprises a third conductive layer stacked on the second conductive layer, a grain size of the third conductive layer is substantially equal to the grain size of the second conductive layer.

19. A method for manufacturing a semiconductor device package, comprising:
- forming a dielectric layer including one or more conductive wirings;
- forming a semiconductor chip on the dielectric layer;
- forming an antenna, which includes forming a first conductive layer on the dielectric layer by performing a first operation and forming a second conductive layer interfacing the first conductive layer by performing a second operation,
- wherein a grain size of the second conductive layer formed by the second operation is smaller than a grain size of the first conductive layer formed by the first operation, and
- wherein the semiconductor chip is configured to be electrically coupled to the antenna through the one or more conductive wirings.

20. The method of claim 19, further comprising grinding the first conductive layer to reduce a surface roughness of the first conductive layer prior to the second operation.

\* \* \* \* \*